(12) United States Patent
Letavic

(10) Patent No.: US 7,544,998 B2
(45) Date of Patent: Jun. 9, 2009

(54) PREVENTION OF PARASITIC CHANNEL IN AN INTEGRATED SOI PROCESS

(75) Inventor: Theodore Letavic, Putnam Valley, NY (US)

(73) Assignee: NXP B.V., Eindhoven (NL)

( * ) Notice: Subject to any disclaimer, the term of this patent is extended or adjusted under 35 U.S.C. 154(b) by 2 days.

(21) Appl. No.: 10/560,573

(22) PCT Filed: Jun. 8, 2004

(86) PCT No.: PCT/IB2004/001851

§ 371 (c)(1),
(2), (4) Date: Dec. 12, 2005

(87) PCT Pub. No.: WO2004/109810

PCT Pub. Date: Dec. 16, 2005

(65) Prior Publication Data

US 2006/0145256 A1     Jul. 6, 2006

Related U.S. Application Data

(60) Provisional application No. 60/477,542, filed on Jun. 11, 2003.

(51) Int. Cl.
*H01L 29/78* (2006.01)

(52) U.S. Cl. ............... 257/347; 257/348; 257/E21.112

(58) Field of Classification Search .............. 257/213, 257/288, 347–354, 392, 402, 547, E27.112
See application file for complete search history.

(56) References Cited

U.S. PATENT DOCUMENTS

| 5,359,219 | A | * | 10/1994 | Hwang | 257/351 |
|---|---|---|---|---|---|
| 5,864,161 | A | * | 1/1999 | Mitani et al. | 257/347 |
| 5,982,002 | A | | 11/1999 | Takasu et al. | |
| 6,255,704 | B1 | * | 7/2001 | Iwata et al. | 257/401 |
| 6,339,244 | B1 | * | 1/2002 | Krivokapic | 257/349 |
| 6,545,318 | B1 | * | 4/2003 | Kunikiyo | 257/349 |
| 6,605,843 | B1 | * | 8/2003 | Krivokapic et al. | 257/347 |

FOREIGN PATENT DOCUMENTS

| EP | 0 373 893 | 6/1990 |
|---|---|---|
| EP | 0 497 126 | 8/1992 |
| EP | 0 574 137 | 12/1993 |
| EP | 1 229 576 | 8/2002 |

\* cited by examiner

*Primary Examiner*—Brook Kebede

(57) ABSTRACT

A Silicon on Insulator device is disclosed wherein a parasitic channel induced in a thin film portion of the device is prevented from allowing current flow between the source and drain by a Deep N implant directly below the source or drain. The deep N implant prevents a depletion region from being formed, thereby cutting off current flow between the source and the drain that would otherwise occur.

15 Claims, 4 Drawing Sheets

PREVENTION OF PARASITIC CHANNEL IN AN INTEGRATED SOI PROCESS

CROSS REFERENCE TO RELATED APPLICATION

This application claims the benefit of U.S. provisional application Ser. No. 60/477,542 filed 11 Jun. 2003, which is incorporated herein whole by reference.

TECHNICAL FIELD

This invention relates to CMOS devices, and more specifically, to a technique of achieving elimination of the parasitic MOS channel present in thin film CMOS devices configured in the source, or what is called the source follower, configuration. Also disclosed is a methodology of performing a deep N implant in order to effectuate the inventive structure. Although most applicable in PMOS devices, the invention may also be utilized in the NMOS configuration.

BACKGROUND AND SUMMARY OF THE INVENTION

FIG. 1 shows a thin film CMOS device including a source 101, drain 102, and MOS gate region 103. The SOI layer 104 forms an MOS junction 105 with an buried oxide layer 106. Below buried oxide layer 106 is a substrate layer 107, which would typically be several hundred microns thick. On the scale shown in FIG. 1, the substrate layer 107 is too thick to depict and thus is not fully shown.

In source follower mode, sometimes called source high mode, the source 101 is biased with a voltage that is typically higher than the voltage at which substrate 107 is kept. This voltage difference could be over two hundred volts in typical applications. In thin film devices where the SOI layer 104 may be only slightly more than a micron thick, this voltage difference may be sufficient to induce an unwanted depletion region at or near the MOS junction 105. As shown therefore in FIG. 1, a parasitic path 110 between source 101 and drain 102 exists at the MOS junction. This region creates a parasitic MOS channel, allowing leakage current to be conveyed between the source 101 and drain 101 when the real MOS gate region 103 is intended to be turned off. The device thus undesirably acts as if a second gate region existed, wherein the second gate is in the on state even when the actual gate region 103 is in the off state.

To date, there exists no known solution for stopping this leakage current when thin film SOI devices are utilized in the source follower configuration. Prior solutions all involve use of a much thicker SOI layer 104, rather than thin film devices. These prior devices have such a thick SOI layer that the depletion region resulting in the parasitic MOS channel 110 does not occur. However, in thin film applications the region 110 acts as a second current path in addition to the normal gate region.

There exists a need in the art for a technique of eliminating this parasitic channel 110 in source follower configurations with thin film SOI devices.

In complimentary arrangements, (i.e. using NMOS devices in which the source is biased much lower than the substrate) a similar problem may exist.

DETAILED DESCRIPTION OF THE PREFERRED EMBODIMENT

Figure 1:
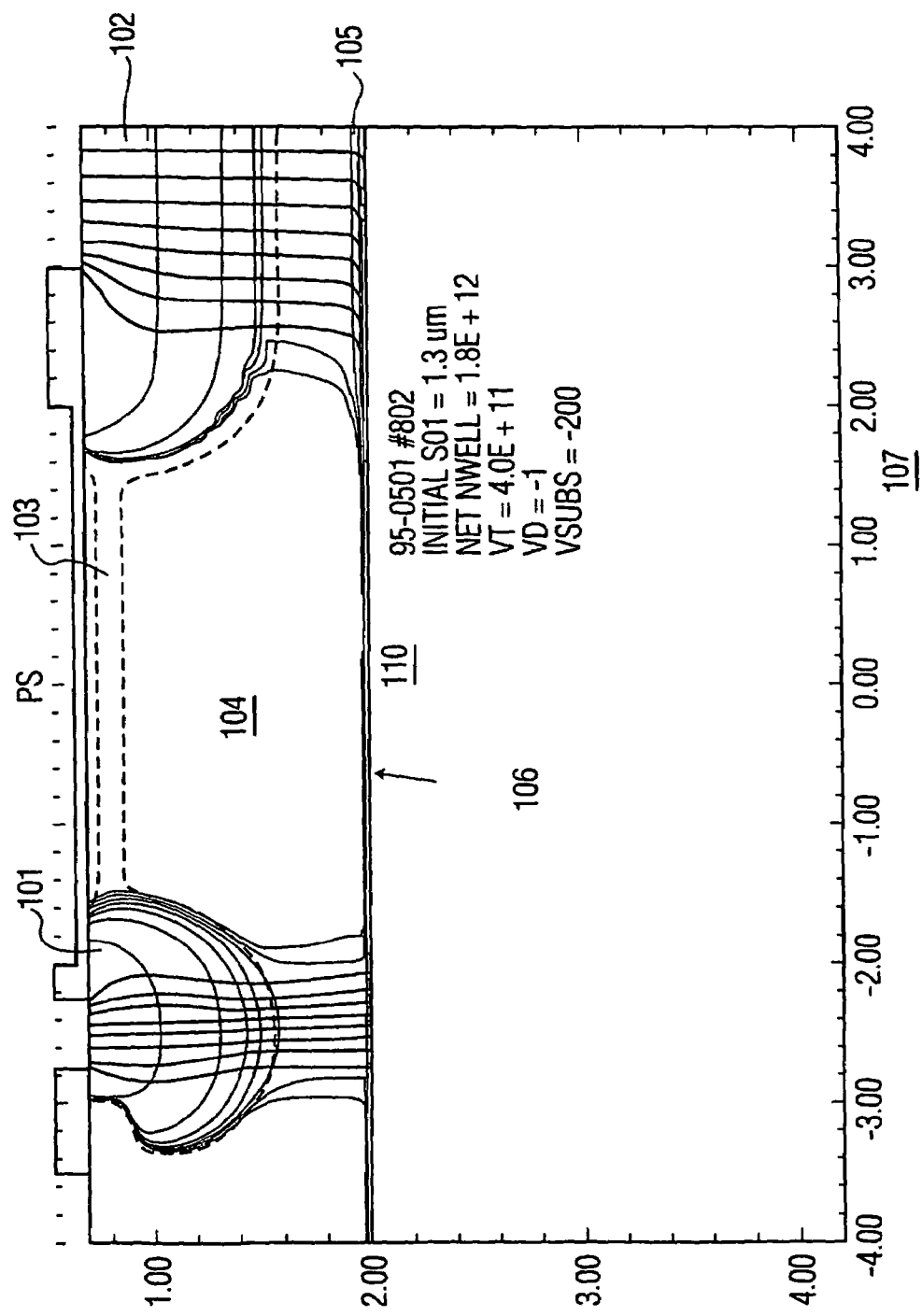
FIG. 1 is a depiction of a prior art CMOS thin film device, showing a parasitic MOS channel 110.
Figure 2:
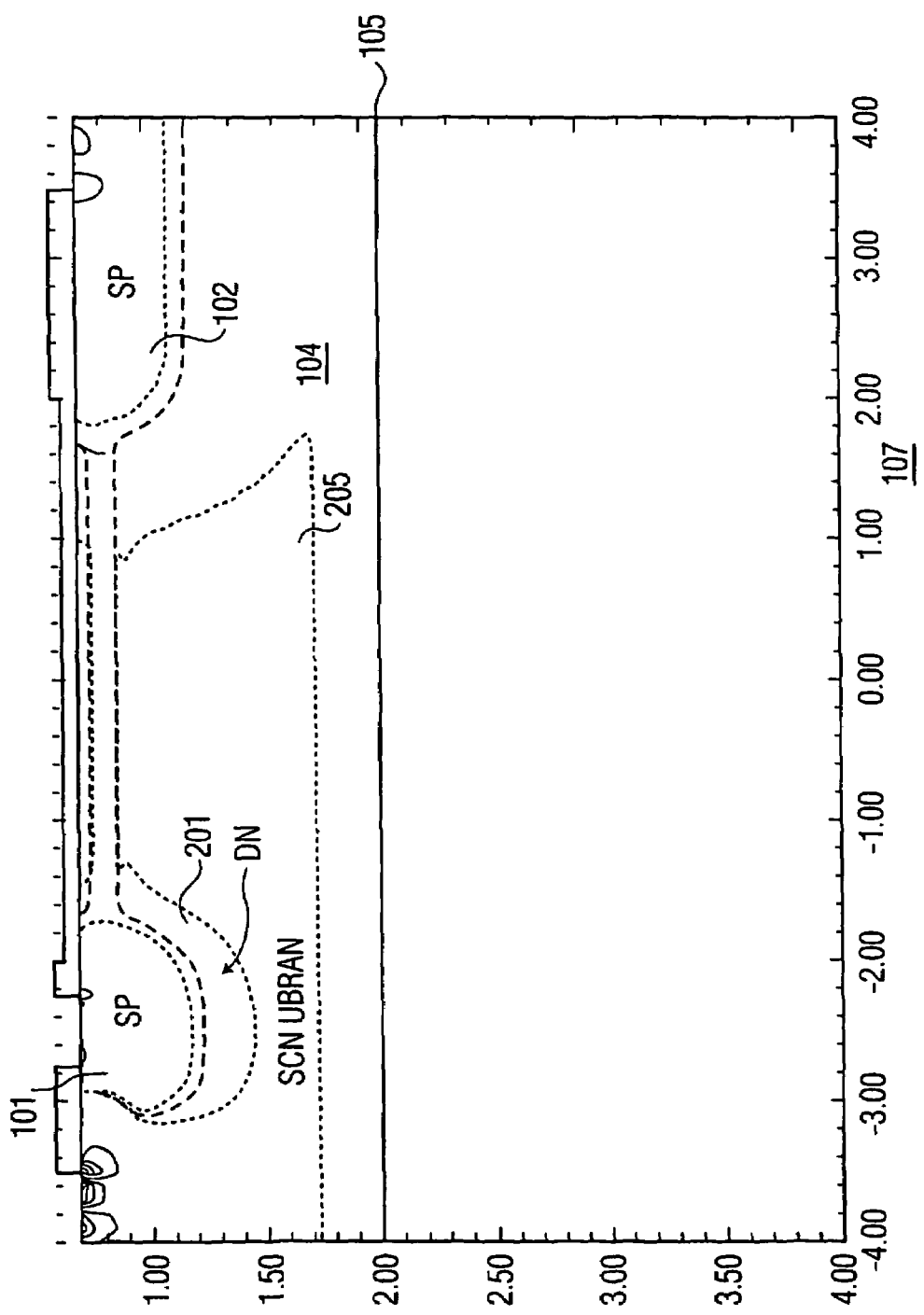
FIG. 2 is a conceptual depiction of a device fabricated in accordance with the present invention.

FIG. 2 depicts an exemplary PMOS device including the deep N layer 201 placed below the source region 101. A substrate region 107 is maintained at an exemplary voltage of −200, over 200 volts lower that the typical voltage at which the source is biased. Due to the relatively thin SOI layer 104, (slightly more than 1 micron) a parasitic MOS channel 110 results from a depletion region that forms between the drain 102 and source 101 as indicated in FIG. 1. However, the deep N layer 201 shown directly below the source region 101 prevents full depletion and instead forms the space charge neutral region 205 as indicated in dotted outline in FIG. 2. This space charge neutral region 205 prevents current flow between the source 101 and drain 102 along any parasitic channel than may otherwise be formed across MOS channel 110.

In the preferred embodiment, the implantation of the deep N layer 201 should be accomplished using a doubly ionized implant of 31 P++ and a 200 KeV implant machine. This gives 400 KeV implant energy, without the need for a high energy implant machine.

It is also noted that while the deep N layer is shown below the source region 101 in FIG. 2, it is noted that the space charge neutral region 205 may be implemented anywhere along what would otherwise be the parasitic current path 110 between the source 101 and drain 102. Thus, the deep N layer 201 may be placed directly below drain region 102, rather than below source region 101.

While the device has principal application in source high PMOS configurations, the complimentary device may be implemented in NMOS as well. Such an MMOS device would involve the P implant below the source or drain in similar concentration to those already described, and would be applicable in arrangements where the bias configuration of the device is the reverse of what has been described herein with respect to PMOS devices.

Figure 3A:
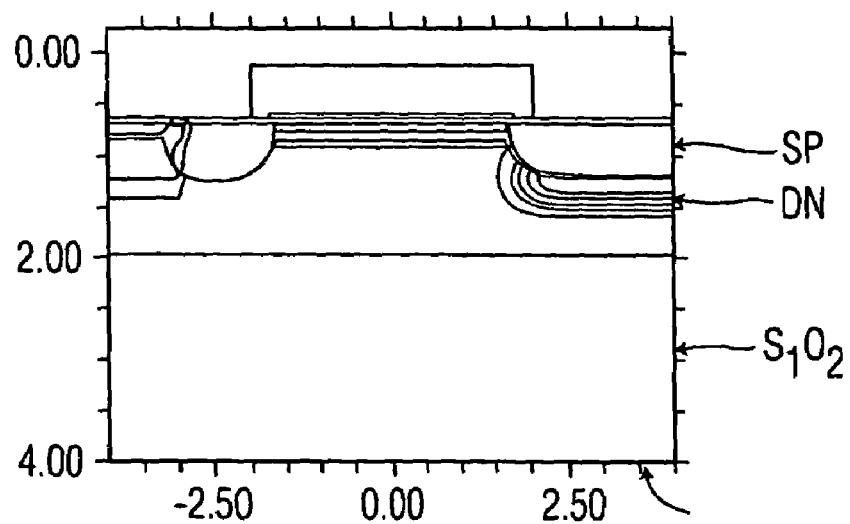
FIGS. 3A-D depict doping concentrations at various locations throughout the device.
Figure 3B:
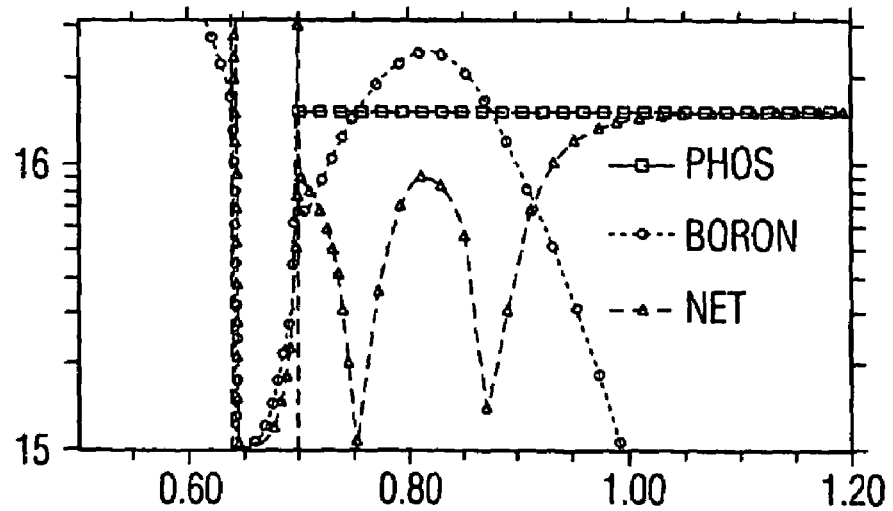
Figure 3C:
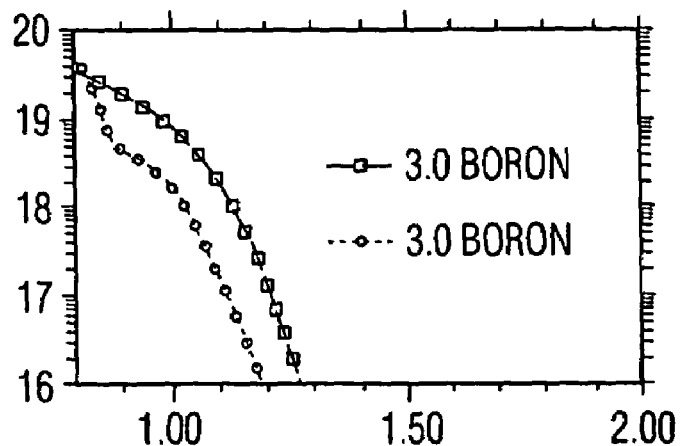
Figure 3D:
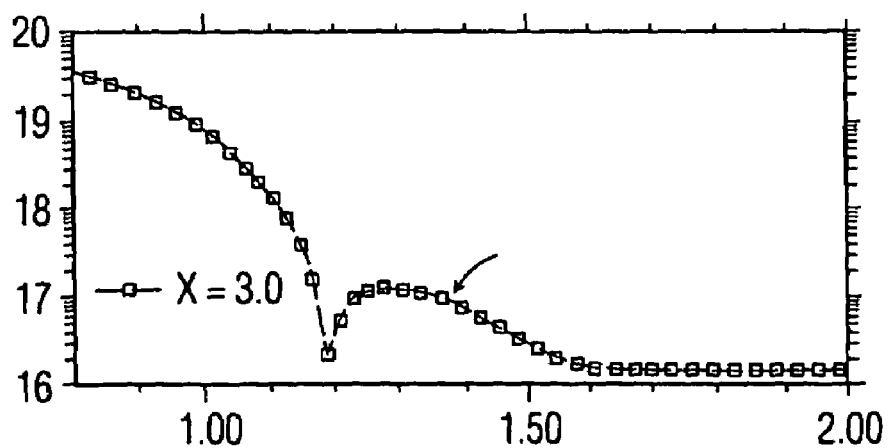

FIGS. 3A-D show further manufacturing information regarding the implementation of the present invention in a PMOS device. FIG. 3A depicts a cross section showing the relative thickness of the various portions of the device previously described. The device depicted in 3A is doped in concentrations profiled in FIG. 3B. Note that FIGS. 3C and 3D compare the doping concentrations present in the source and drain regions respectfully. Note the concentration of the doping in the deep N region is shown is FIG. 3D as being approximately 1 order of magnitude higher than the concentration shown in FIG. 3B for the Nwell, the gate region.

It is noted that while the above describes the preferred embodiment of implementing the invention, various modifications and additions will be apparent for those that are skilled in the art. Such modifications are intended to be covered by the claims appended hereto.)

What is claimed is:

1. A thin film Silicon on Insulator (SOI) device comprising:
   a source;
   a gate;
   a drain;
   an SOI layer;
   a substrate layer configured and arranged, when the substrate layer is maintained at a potential sufficiently lower than a potential of the source, to form a parasitic MOS channel is between the source and drain; and a Deep N implant layer configured and arranged to prevent flow of current between the source and drain via the parasitic MOS channel when the device is in an off state.

2. The device of claim 1 wherein the Deep N implant layer is between the source and the SOI layer.

3. The device of claim 1 wherein the Deep N implant layer is formed between the drain and the SOI layer.

4. The device of claim 1, wherein the substrate layer is configured and arranged to form the parasitic MOS channel when the substrate layer is maintained at a potential that is about 200 volts lower than the potential of the source.

5. The device of claim 1, wherein the SOI layer has a thickness of about 1 micron.

6. The device of claim 1, wherein the Deep N implant layer has a doping concentration about 1 order of magnitude higher than that of a gate region associated with the gate.

7. The device of claim 1, wherein
the SOI layer is on the substrate layer,
the implant layer is over a portion of the SOI layer that is in contact with the substrate layer and prevents current flow between the underlying substrate layer and at least one of a source and a drain over the implant layer.

8. A thin film Silicon on Insulator (SOI) device comprising:
a source and a drain;
a gate between the source and the drain to control on and off states of the device;
a substrate layer;
a deep implant layer adjacent to at least one of the source and the drain; and
an SOI layer between the substrate layer and the deep implant layer,
wherein, when the substrate layer is maintained at a potential sufficiently different than a potential of the source, the substrate layer forms a parasitic MOS channel between the source and drain, and
wherein the deep implant layer prevents flow of current between the source and drain via the parasitic MOS channel when the device is in an off state.

9. The device of claim 8, wherein the deep implant layer is between the source and the SOI layer.

10. The device of claim 8, wherein the deep implant layer is between the drain and the SOI layer.

11. The device of claim 8, wherein the deep implant layer is a Deep P implant layer.

12. The device of claim 8, wherein the deep implant layer is a Deep N implant layer.

13. The device of claim 8, wherein
the SOI layer is on the substrate layer,
at least one of the source and the drain is over the implant layer, and
the implant layer prevents current flow between the at least one of the source and the drain and the underlying substrate layer.

14. A thin film Silicon on Insulator (SOI) device comprising:
a substrate susceptible to parasitic MOS channel formation; and
a silicon layer on the substrate, the silicon layer including a source,
a drain,
a deep implant region extending below and laterally adjacent at least one of the source and drain, and configured and arranged to prevent current flow between a parasitic MOS channel in the substrate and the at least one of the source and drain when the device is in an off state, and
a channel region above the deep implant region and between the source and drain.

15. The device of claim 14, wherein the deep implant region has an implant concentration that is at least an order of magnitude higher than the concentration of gate, to prevent current flow between the parasitic MOS channel in the substrate and the at least one of the source and drain when the device is in an off state.

* * * * *